United States Patent
Park et al.

(10) Patent No.: US 7,586,576 B2
(45) Date of Patent: Sep. 8, 2009

(54) MOTHER PLATE FOR A FLEXIBLE PRINTED CIRCUIT FILM FORMED WITH A CUTTING PATTERN AND DISPLAY DEVICE PROVIDED WITH A FLEXIBLE PRINTED CIRCUIT FILM CUT FROM THE SAME

(75) Inventors: Hee-Young Park, Gyeonggi-do (KR); Yun-Hee Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 281 days.

(21) Appl. No.: 11/240,260

(22) Filed: Sep. 29, 2005

(65) Prior Publication Data

US 2006/0146263 A1 Jul. 6, 2006

(30) Foreign Application Priority Data

Jan. 4, 2005 (KR) .................... 10-2005-0000412

(51) Int. Cl.
*G02F 1/1345* (2006.01)
(52) U.S. Cl. ........................................ 349/150; 349/42
(58) Field of Classification Search .................. 349/42, 349/43, 150, 152
See application file for complete search history.

(56) References Cited

U.S. PATENT DOCUMENTS

| | | | | |
|---|---|---|---|---|
| 5,288,950 A | * | 2/1994 | Ushio et al. ................. | 174/254 |
| 6,052,172 A | * | 4/2000 | Kajiwara et al. ............ | 349/152 |
| 6,509,949 B1 | * | 1/2003 | Lu et al. ..................... | 349/187 |
| 6,778,247 B2 | | 8/2004 | Lee et al. | |
| 7,281,324 B2 | * | 10/2007 | Kent et al. .................... | 29/846 |
| 2002/0050788 A1 | * | 5/2002 | Kimura et al. .............. | 313/582 |

FOREIGN PATENT DOCUMENTS

| | | |
|---|---|---|
| JP | 2003-086999 | 3/2003 |
| JP | 2003-131254 | 5/2003 |
| JP | 2004-006632 | 1/2004 |
| JP | 2004-184839 | 7/2004 |
| KR | 100213449 | 5/1999 |
| KR | 1020000014934 | 3/2000 |
| KR | 1020010083971 | 9/2001 |
| KR | 1020010095950 | 11/2001 |

\* cited by examiner

*Primary Examiner*—Frank G Font
*Assistant Examiner*—Eric Wong
(74) *Attorney, Agent, or Firm*—Haynes and Boone, LLP

(57) ABSTRACT

The present invention relates to a mother plate for a flexible printed circuit film with a cutting mark and a display device provided with a flexible printed circuit film cut from the same. The display device includes a display panel for a panel unit displaying an image, a display panel electrode formed on the display panel, and a flexible printed circuit film electrically connected to a terminal of the display panel electrode. The flexible printed circuit film includes a wiring electrically connected to the display panel electrode, and a cutting mark having a cutting portion formed to be adjacent to the wiring in at least one edge of the flexible printed circuit film.

27 Claims, 9 Drawing Sheets

MOTHER PLATE FOR A FLEXIBLE PRINTED CIRCUIT FILM FORMED WITH A CUTTING PATTERN AND DISPLAY DEVICE PROVIDED WITH A FLEXIBLE PRINTED CIRCUIT FILM CUT FROM THE SAME

CROSS-REFERENCE TO RELATED APPLICATIONS

The present application claims priority to Korean patent application No. 2005-0000412 filed in the Korean Intellectual Property Office on Jan. 4, 2005, the content of which is herein incorporated by reference in its entirety.

BACKGROUND OF THE INVENTION (a) Field of the Invention

The present invention relates generally to a mother plate for a flexible printed circuit film with a cutting mark and a display device made with a flexible printed circuit film cut from the mother plate, and more particularly to a mother plate for a flexible printed circuit film that is easy to cut and a display device provided with the flexible printed circuit film.

(b) Description of the Related Art

Due to the recent development of semiconductor technologies, the demand for display devices of small size, light weight, and high performance has increased explosively. Naturally, liquid crystal display (LCD) devices, which have the desired characteristics of small size, light weight, and low power consumption, have been receiving much attention as a substitute for cathode ray tubes (CRTs). Today, LCD devices are widely used for all types of data processing systems that require a display device.

Generally, an LCD device is a display device that displays information through light modulation. Light modulation is achieved by changing the alignments of liquid crystal molecules, which in turn is done by adjusting the applied voltage. Adjustment of the voltage that is applied to the liquid crystal molecules causes changes in the liquid crystals' optical characteristics such as birefringence, optical rotary power, dichroism, and optical scattering, all of which translate to a visual change.

Such LCD devices are used for most flat display devices, like cellular phones, monitors, TVs, etc., and as rapid technological developments have been made, they have become available with higher definition, lighter weight, and thinner shape than before.

The technological development of the LCD devices is accompanied by progress in the thin film transistor (TFT) technology, driver integrated circuit (IC) chip, and flexible printed circuit film as an electrical connection member capable of micropitching.

A flexible printed circuit film of the LCD device can be interposed between an LCD panel and a circuit unit to connect them. The flexible printed circuit film with a driver IC chip is used for COF (chip on film), TCT (tape carrier package), etc.

When the flexible printed circuit film is connected with other elements, it is important for the connecting portion to stay securely closed. If the connecting portion opens, it causes reduction of device life span or malfunction. However, in conventional LCD devices, there were many cases where the panel with the thin film transistors and the flexible printed circuit film are not properly connected, causing the connection to open. The open connecting portion erodes, causing a malfunction of the product. Such an open connecting portion occurs when the electrode terminal of the flexible printed circuit film corresponding to the connecting portion is not properly cut during the manufacturing of the flexible printed circuit film. If the flexible printed circuit film is connected to the electrode in an improperly cut state, a gap will form. If the gap is detected after the flexible printed circuit film is connected to the LCD panel, the product defect rate is increased.

Accordingly, manufacturing high-quality flexible printed circuit film directly improves the quality of the display device. Precise, gapless connection between the flexible printed circuit film and the electrode terminal of the display device is also desired for improving display device quality.

SUMMARY OF THE INVENTION

There is provided a mother plate for a flexible printed circuit film in which a cutting mark is formed to prevent the electrode from opening an electrical connection.

Also, there is provided a display device with a flexible printed circuit film cut from the mother plate for a flexible printed circuit film.

According to one aspect of the present invention, there is provided a display device including a display panel for a panel unit displaying an image, a display panel electrode formed on the display panel, and a flexible printed circuit film electrically connected to a terminal of the display panel electrode. The flexible printed circuit film includes a wiring electrically connected to the display panel electrode and a cutting mark having a cutting portion formed to be adjacent to the wiring along at least one edge of the flexible printed circuit film.

The cutting portion may be formed substantially parallel to a plane of the display panel electrode.

The flexible printed circuit film may include an align mark for aligning with the display panel electrode.

The flexible printed circuit film may have a dummy area that is not electrically connected to the display panel electrode, and the align mark can be formed in the dummy area.

It is preferable that the cutting mark is formed in the dummy area of the flexible printed circuit film that is not involved with the electrical connection with the display panel electrode and the cutting mark is formed in the dummy area.

The dummy area may have a dummy wiring, and the cutting mark can be connected to the dummy wiring, spaced apart from the dummy wiring.

The flexible printed circuit film may further include a base film receiving the wiring and the cutting mark, and a cover film formed on the base film exposing the wiring.

The cutting portion and the edge of the wiring form a substantially straight line.

It is preferable that the cutting mark may be formed at the edge of the base film.

Preferably, the cutting mark may be exposed on the base film together with the wiring.

The cutting mark may have a rectangular shape.

It is preferable that the width of the cutting mark is greater than the width of the wiring.

It is preferable that a driver integrated circuit chip is mounted in the flexible printed circuit film.

The display panel electrode can be electrically connected to a driver integrated circuit chip mounted in the display panel.

The display device of the present invention may further include a backlight assembly for supplying light to the display panel.

The cutting mark may be extended along the direction parallel with the wiring.

It is preferable that the length of the cutting mark along the direction parallel to the length of the wiring is 100 µm to 200 µm.

The display device of the present invention may further include a color filter panel disposed on the display panel, and a liquid crystal interposed between the display panel and the color filter panel. The display panel may be a thin film transistor panel.

The display device may be for a cellular phone.

According to another aspect of the present invention, there is provided a mother plate for a flexible printed circuit film including a base film, and a plurality of wiring units formed on the base film. Each of the wiring units includes a plurality of wirings with a predetermined pattern formed on the base film, and at least one cutting mark formed adjacent to the wiring. A cutting line for separating each of the wiring units from the mother plate for a flexible printed circuit film extends across the cutting mark and the wiring.

It is preferable that the cutting line is formed as a straight line along the width direction of the wiring.

Preferably, the cutting line passes through the center of the cutting mark.

BRIEF DESCRIPTION OF THE DRAWINGS

These and other aspects and advantages of the present invention will become apparent and more readily appreciated from the following description of the embodiments, taken in conjunction with the accompanying drawings, of which.

DETAILED DESCRIPTION OF THE EMBODIMENTS

Reference will now be made in detail to the embodiments of the present invention, examples of which are illustrated in the accompanying drawings. The embodiments are described below to explain the present invention by referring to the figures.

Figure 1:
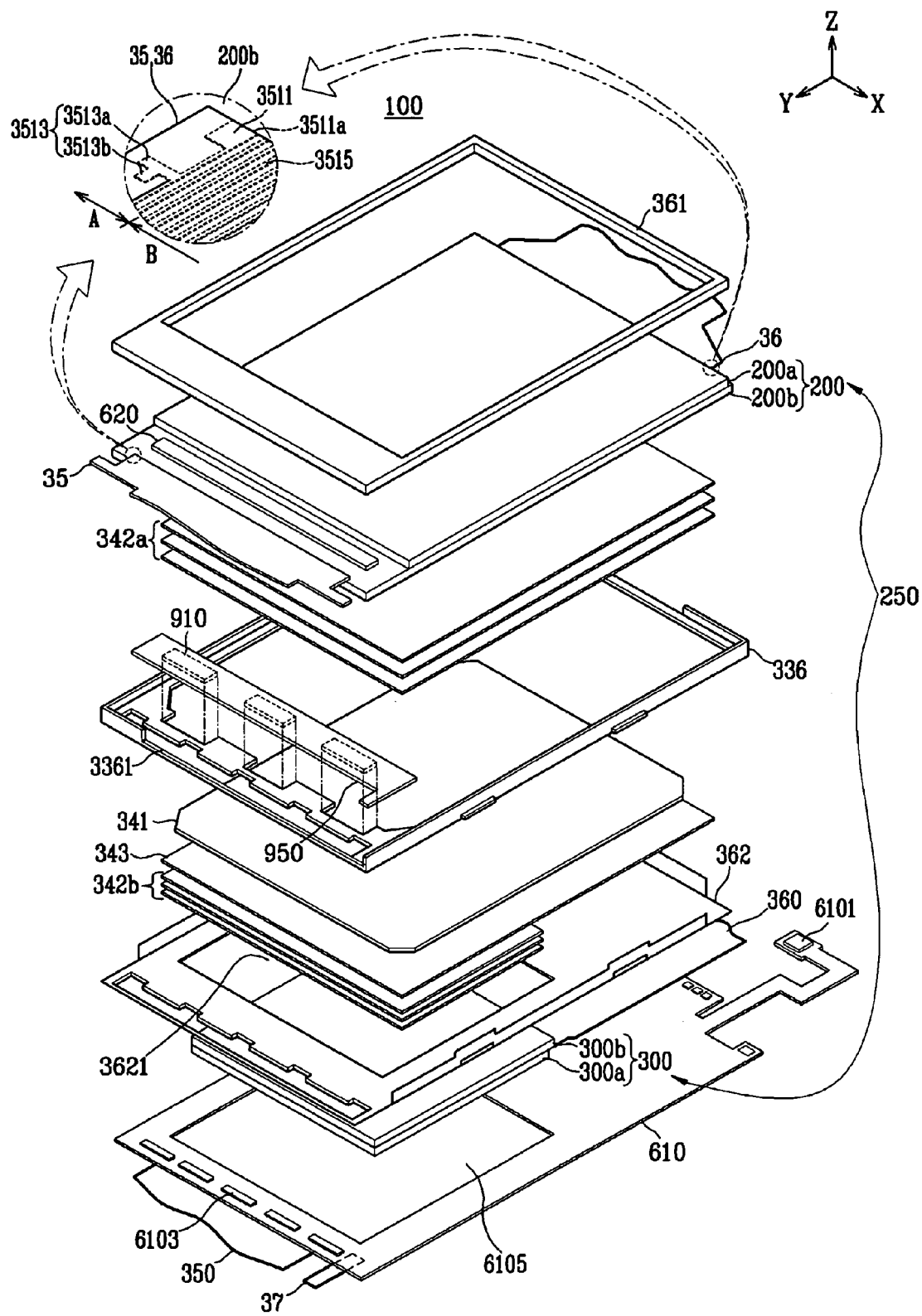
FIG. 1 is an exploded perspective view of a display device according to a first embodiment of the present invention.

FIG. 1 is an exploded perspective view of a display device having a main panel unit 200 and a sub panel unit 300. Although FIG. 1 shows a dual-display device as one embodiment of the present invention in which the main panel unit 200 and the sub panel unit 300 are arranged in substantially parallel planes, the applicability of the present invention is not limited to dual-display devices. The dual-display embodiment is shown to exemplify the structure and arrangement of the display device according to the present invention, and the structure and arrangement of the display device can take various other forms.

The display device 100 shown in FIG. 1 includes panel units 200 and 300 and a light source 910 for supplying light to the panel units. In addition, a top chassis 361, a mold frame 336, and a bottom chassis 362 are mounted to fix the panel units and the light source.

A panel unit assembly 250 includes a main panel unit 200, a sub panel unit 300, a first flexible printed circuit film 35, a second flexible printed circuit film 36, a driver IC chip 620, and a printed circuit board (PCB) 610.

Although FIG. 1 shows two panel units, this is intended only to exemplify the present invention, not to limit the present invention. Accordingly, a device including at least two panel units is sufficient for the present invention. In addition, although FIG. 1 shows the panel units 200 and 300 as specifically being LCD panels, this is done to exemplify the present invention, not to limit the scope of the invention. Accordingly, a device including at least one LCD panel is sufficient for the present invention, and an organic light emitting display (OLED) panel can also be used instead of the LCD panel.

The main panel unit 200 is larger than the sub panel unit 300. The display device 100 can be used for a clamshell-type cellular phone, in which the main panel unit 200 is positioned on an inner surface of the cellular phone and the sub panel unit 300 is positioned on an outer surface of the cellular phone. Accordingly, the sub panel unit 300 of a small screen can provide a limited amount of information, such as time, date, etc. to the user even without the phone being opened. When making a telephone call, the cellular phone is opened and the main panel unit 200 of a large screen provides extra information.

The following will describe in detail the inner structure of the main panel unit 200 of the LCD panel. Since the structure of the sub panel unit 300 is the same as the structure of the main panel unit 200, detailed description of the sub panel unit 300 will be omitted.

A TFT panel 200b of a display panel for a panel unit displaying an image is a transparent glass panel on which thin film transistors are formed in a matrix, wherein source terminals are connected to data lines, and gate terminals are connected to gate lines. The data lines and the gate lines are formed as a display panel electrode on the TFT panel 200b. Pixel electrodes made of ITO (Indium Tin Oxide), a transparent conductive material, are formed at drain terminals.

If electrical signals from the PCB 610 are input to the data lines and the gate lines of the main panel unit 200, electrical signals are input to the source terminals and the gate terminals of the thin film transistors. When the thin film transistors are turned on or off depending on the electrical signals, electrical signals required for forming an image are output to the drain terminals.

A color filter panel 200a is disposed substantially parallel to the TFT panel 200b. The color filter panel 200a is a panel on which RGB pixels, as color pixels for emitting predetermined colors due to a passage of light, are formed using a thin film forming process. A common electrode made of ITO is formed on the whole surface of the color filter panel 200a. When power is applied to the gate terminals and the source terminals of the thin film transistors and the thin film transistors are turned on, an electric field forms between the pixel electrodes and the common electrode of the color filter panel. Alignment angles of the liquid crystal molecules interposed between the TFT panel 200b and the color filter panel 200a change due to the electric field, and light transmittance is adjusted according to the changed alignment angle, thereby obtaining a desired image. Polarizers (not shown) are attached on the two outer surfaces of the TFT panel 200b and the color filter panel 200a.

To control the alignment angles and the alignment timing of the liquid crystal molecules in the main panel unit 200, the driver IC chip 620 supplies driving signals and timing signals to the gate lines and the data lines of the thin film transistors. The driver IC chip 620 is attached on the TFT panel 200b. Although not shown in FIG. 1, a protective layer is coated around the driver IC chip 620 to protect it from various environmental elements. The driver IC chip 620 generates a plurality of timing signals to apply data driving signals and gate driving signals for driving the main panel unit 200 at a proper time, and supplies the gate driving signals and the data driving signals to the gate lines and the data lines of the main panel unit 200, respectively.

The second flexible printed circuit film 36 wraps around a surface of the bottom chassis 362 and connects the main panel unit 200 and the sub panel unit 300 to each other. Although FIG. 1 shows the second flexible printed circuit film 36 as being cut off, this is done for clarity of illustration and the flexible printed circuit film 36 is connected to the main panel unit 200 and the sub panel unit 300. Since the main panel unit 200 and the sub panel unit 300 are connected to each other, the driving signals of the driver IC chip 620 are transmitted to the sub panel unit 300 through the main panel unit 200. Accordingly, the sub panel unit 300 can be controlled through the driver IC chip 620.

A plurality of resistance elements 6103 are mounted in the PCB 610 transmitting the signals to the first flexible printed circuit film 35, and a tail portion receiving the cellular phone connector 6101 is formed at an edge of the PCB 610 to connect the cellular phone with an external component.

The first flexible printed circuit film 35 receives signals about the opening and closing of the foldable cellular phone through the cellular phone connector 6101. The first flexible printed circuit film 35 connects the main panel unit 200 and the printed circuit board 610. Although FIG. 1 shows the first flexible printed circuit film 35 as being cut off, this is done for clarity of illustration and the flexible printed circuit film 35 is in fact connected to the main panel unit 200 and the printed circuit board 610.

The light source 910 is disposed between the main panel unit 200 and the sub panel unit 300 to supply uniform light to both panel units 200 and 300. The brightness of the light emitted from the light source 910 is improved using a light guiding plate 341, a reflecting sheet 343 and a pair of a plurality of optical sheets 342a and 342b, and the light is supplied to the panel units 200 and 300.

The light guiding plate 341 guides the light emitted from the light source 910 to the panel units 200 and 300. The reflecting sheet 343 reflects and transmits the light emitted from the light source 910. The reflecting sheet 343 transmits a part of the light emitted from the light source 910 to supply the light to the sub panel unit 300. A pair of optical sheets 342a and 342b improves the brightness of the light.

Although FIG. 1 shows a light emitting diode (LED) 910 mounted as a light source on a circuit board 950, this only exemplifies the present invention and is not intended to limit the scope of the invention. Accordingly, the light source can take various other forms including line light sources or area light sources with light emitting diodes, as well as lamps. The circuit board 950 connected to a third flexible printed circuit film 37 drives the light source 910 by receiving light source control signals from the PCB 610.

The mold frame 336 receives the circuit board 950 on which the light source 910 is mounted, and fixes the panel unit assembly 250. The bottom chassis 362 has an opening 3621 to fix the sub panel unit 300. The bottom surface of the bottom chassis 362 is covered with the PCB 610 having an opening 6105 through which images on the sub panel unit 300 is viewed by the user.

The enlarged circle of FIG. 1 shows an enlarged view of a part of the first flexible printed circuit film 35 and the second flexible printed circuit film 36 electrically connected to the terminal of the display panel electrode formed on the TFT panel 200b.

Although FIG. 1 shows that both the first flexible printed circuit film 35 and the second flexible printed circuit film 36 have the same wiring mark (as shown in the enlarged circle), this only exemplifies the present invention and is not intended to limit the scope of invention. In some embodiments, only one of the first flexible printed circuit film 35 and the second flexible printed circuit film 36 has the wiring mark that is shown in the enlarged circle of FIG. 1.

In addition, although FIG. 1 shows that a cutting mark 3511 is formed on the flexible printed circuit films 35 and 36, this is not intended to limit the present invention. Accordingly, it can be applied to various other flexible printed circuit films.

The first flexible printed circuit film 35 and the second flexible printed circuit film 36 are electrically connected to the display panel electrode formed on the TFT panel 200b to transmit the driving signals to the TFT panel 200b. The flexible printed circuit films 35 and 36 include a cutting mark 3511 (dotted line), a wiring 3515 (dotted line), and an align mark 3513.

When a mother plate is cut to form the flexible printed circuit films 35 and 36 (FIG. 2), it is cut based on the cutting mark 3511. Then, the cut flexible printed circuit films 35 and 36 are attached to the TFT panel 200b such that a cutting portion 3511a is substantially parallel to the display panel electrode and faces the display panel electrode formed on the TFT panel 200b. When the flexible printed circuit films 35 and 36 are attached to the TFT panel 200b, the align mark 3513 formed on the flexible printed circuit film to be aligned with the display panel electrode is aligned with an align mark (not shown) formed on the TFT panel 200b. Accordingly, the wirings 3515 are aligned with the display panel electrode formed on the TFT panel 200b. The align mark 3513 has an align mark portion 3513a extending along the X-axis and an align mark portion 3513b extending along the Y-axis. Accordingly, the wirings 3515 are correctly aligned with the align mark formed on the TFT panel 200b to increase the reliability of connection between the wirings 3515 and the display panel electrodes.

The flexible printed circuit films 35 and 36 in which the align mark 3513 is spaced apart from the cutting mark 3511 are attached to the display panel electrode. Due to the formation of the cutting mark 3511, the tolerance between the align mark 3513 and the cutting mark 3511 can be controlled within the range of several μm to several tens of μm, thereby allowing an easy cutting of the mother plate for a flexible printed circuit film 33 (FIG. 2).

The flexible printed circuit films 35 and 36 are divided into a dummy area (A) and an effective area (B) along the direction in which the plurality of the wirings 3515 are arranged (i.e., the border dividing the dummary area (A) from the effective area (B) extend along the Y-axis). The dummy area (A) is an area that is not electrically connected with the display panel electrode formed on the TFT panel 200b, and includes the cutting mark 3511 and the align mark 3513. The effective area (B) adjacent thereto has a plurality of wirings 3515 to be electrically connected to the display panel electrode formed on the TFT panel 200b. The display panel electrode is electrically connected to the driver IC chip 620 mounted on the TFT panel 200b.

Figure 2:
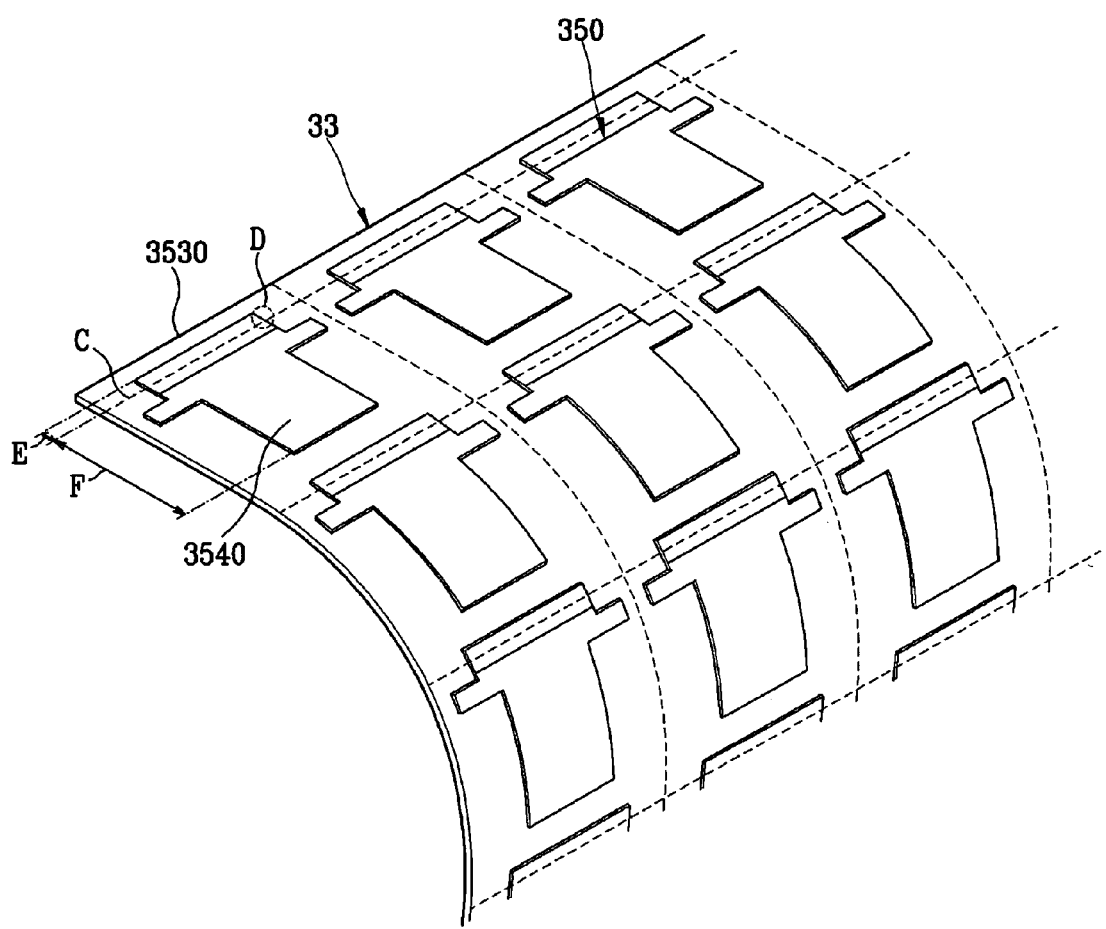
FIG. 2 is a schematic drawing of a mother plate for a flexible printed circuit film according to the first embodiment of the present invention.

FIG. 2 shows the mother plate for a flexible printed circuit film 33 with a cutting line (C). Although not shown in FIG. 2, a plurality of the fine wirings are formed on the mother plate for a flexible printed circuit film 35 one direction.

The mother plate for a flexible printed circuit film 33 shown in FIG. 2 is not intended to limit the present invention but only to exemplify the present invention. Accordingly, the mother plate for a flexible printed circuit film 33 can take various other forms.

Since the mother plate for a flexible printed circuit film 33 is typically rolled up for storage, the mother plate for a flexible printed circuit film 33 is unrolled and cut to manufacture flexible printed circuit films. The mother plate for a flexible printed circuit film 33 includes a base film 3530 and a plurality of wiring units 350 formed on the base film 3530. A cover film 3540 is attached to the wiring units 350 to expose a part of the wiring.

Each of the wiring units 350 can be divided into an unusable area (E) and a usable area (F). Since the wiring in the unusable area (E) can be cut to be aged and tested after manufacturing the mother plate for a flexible printed circuit film 33, the unusable area (E) is discarded by cutting the wiring units 350 along the cutting line (C) to use only the usable area (F). The following will describe the details of the wiring structure of the mother plate for a flexible printed circuit film 33 with reference to FIG. 3A, which is an enlarged view of the D portion of the wiring units 350 shown in FIG. 2.

A wiring unit 350 has a plurality of wirings 3515 and a cutting mark 3511. The plurality of wirings 3515 are formed on the base film 3530 with a predetermined pattern, and the cutting mark 3511 is formed to be adjacent to the wirings 3515. The cutting line (C) extends across the cutting mark 3511 and the wirings 3515. Each of the wiring units 350 is separated from the mother plate for a flexible printed circuit film by cutting the wiring units 350 along the cutting line (C). The cutting line (C) is formed in a straight line along the X-axis, which ensures the reliability of the electrical connection with the display panel electrode formed on the TFT panel. The direction along the X-axis is herein referred to as the widthwise of the wiring 3515, and the direction along the Y-axis is referred to as the lengthwise direction.

The cutting line (C) is set to pass through the center of the cutting mark 3511. Accordingly, the wiring unit 350 is cut along the cutting line (C) passing through the center of the cutting mark 3511 to manufacture the flexible printed circuit film. Since the width of the cutting mark 3511 is greater than the width of the wiring 3515, the cutting mark 3511 can be observed with the naked eye. In addition, since the cutting mark 3511 extends along the direction parallel with the wiring 3515 for a predetermined length ($W_{3511}$), when the wiring unit 350 is cut along the cutting line (C), a spare space can be secured by cutting. The length ($W_{3511}$) of the cutting mark extending along the Y-axis is preferably between about 100 μm and about 200 μm. If the length ($W_{3511}$) is less than about 100 μm, the length is too short so that the terminal of the display panel electrode opens while being attached to the TFT panel after cutting. If the length ($W_{3511}$) is greater than 200 μm, there is a problem such as the tolerance being too high.

After the flexible printed circuit film is manufactured by cutting the wiring unit 350, it is attached on the TFT panel. Then, the align mark 3513 that is formed on the dummy area (A) of the wiring unit 350 is aligned with another align mark formed on the TFT panel, and the flexible printed circuit film is attached to the TFT panel. The align mark 3513 plays a role as the fixing point of the flexible printed circuit film with respect to the TFT panel. Accordingly, it is very important for a good electrical connection to the display panel electrode on the TFT panel to control the length of the wiring unit 350 when cutting. That is, if the flexible printed circuit film is manufactured by cutting the mother plate too short and is then attached and electrically connected to the display panel, the display panel electrode on the TFT panel 200b is exposed, and accordingly, the display device 100 may malfunction.

Considering the above, the wiring unit 350 with the cutting mark 3511 is cut along the cutting line (C) passing through the cutting mark 3511. Accordingly, the wiring unit 350 can be cut to an appropriate length, and the electrical connection with the display panel electrode on the TFT panel can be efficiently achieved. The cutting mark 3511 is formed at a position to cover and not to expose the terminal of the display panel electrode. If the wiring unit 350 is cut over the cutting mark 3511, the flexible printed circuit film is cut to include the unusable area of the wiring unit 350, and so a defective flexible printed circuit film is manufactured. If the wiring unit 350 is cut under the cutting mark 3511, the length of the flexible printed circuit film is too short so that the terminal of the display panel electrode on the TFT panel to which the flexible printed circuit film is attached may open. Accordingly, the cutting line (C) should be set and cut to pass through the center of the cutting mark 3511.

Figure 3A:
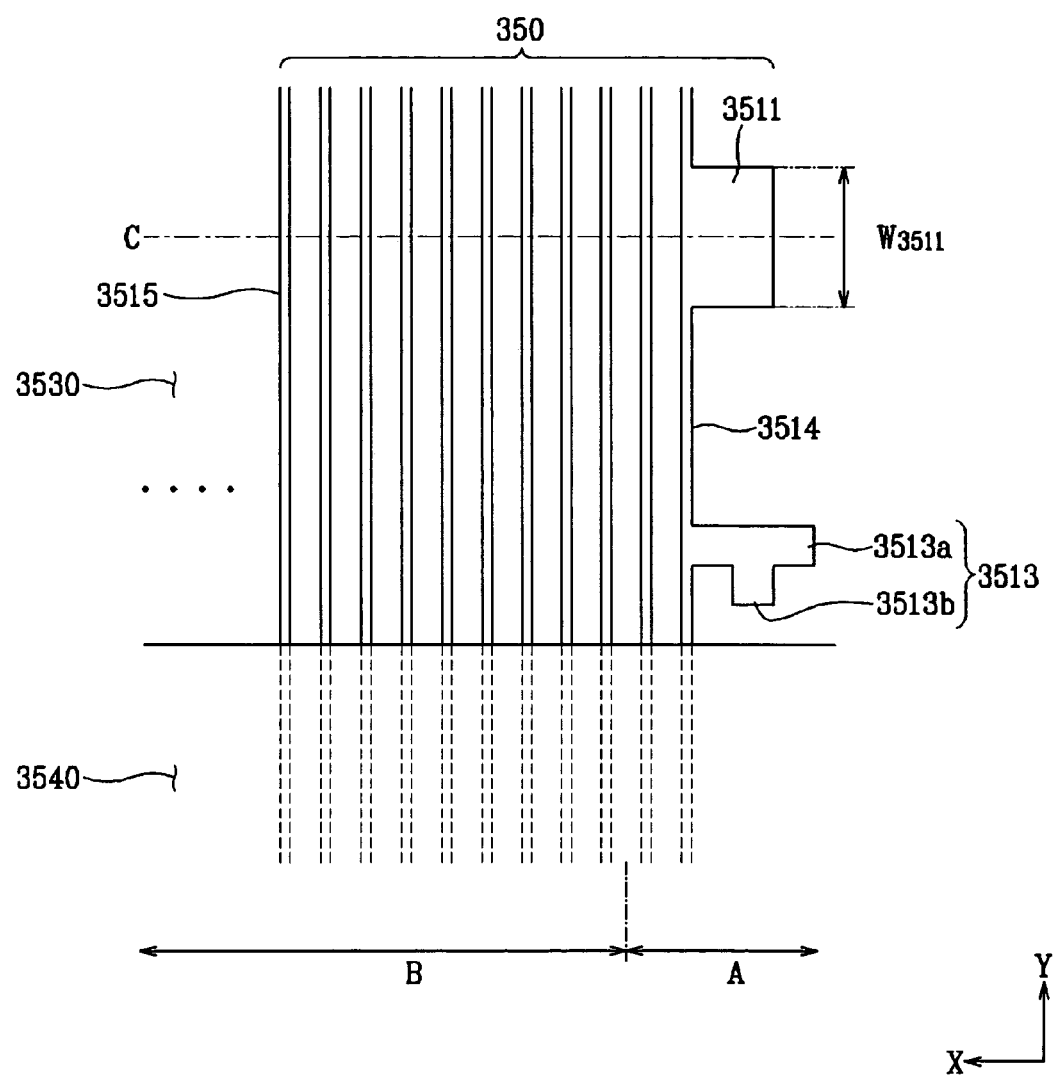
FIG. 3A is an enlarged view of a part of the mother plate for a flexible printed circuit film according to the first embodiment of the present invention.

A dummy wiring 3514 is formed in the dummy area (A) that is not electrically connected with the display panel electrode, and the cutting mark 3511 can be formed to be connected to the dummy wiring 3514. In addition, the cutting mark 3511 can have a simple shape like a rectangle. Although FIG. 3A shows that the cutting mark 3511 has a rectangular shape, this is an example of the present invention and not a limitation. Accordingly, the cutting mark 3511 of the present invention can take various other forms.

Figure 3B:
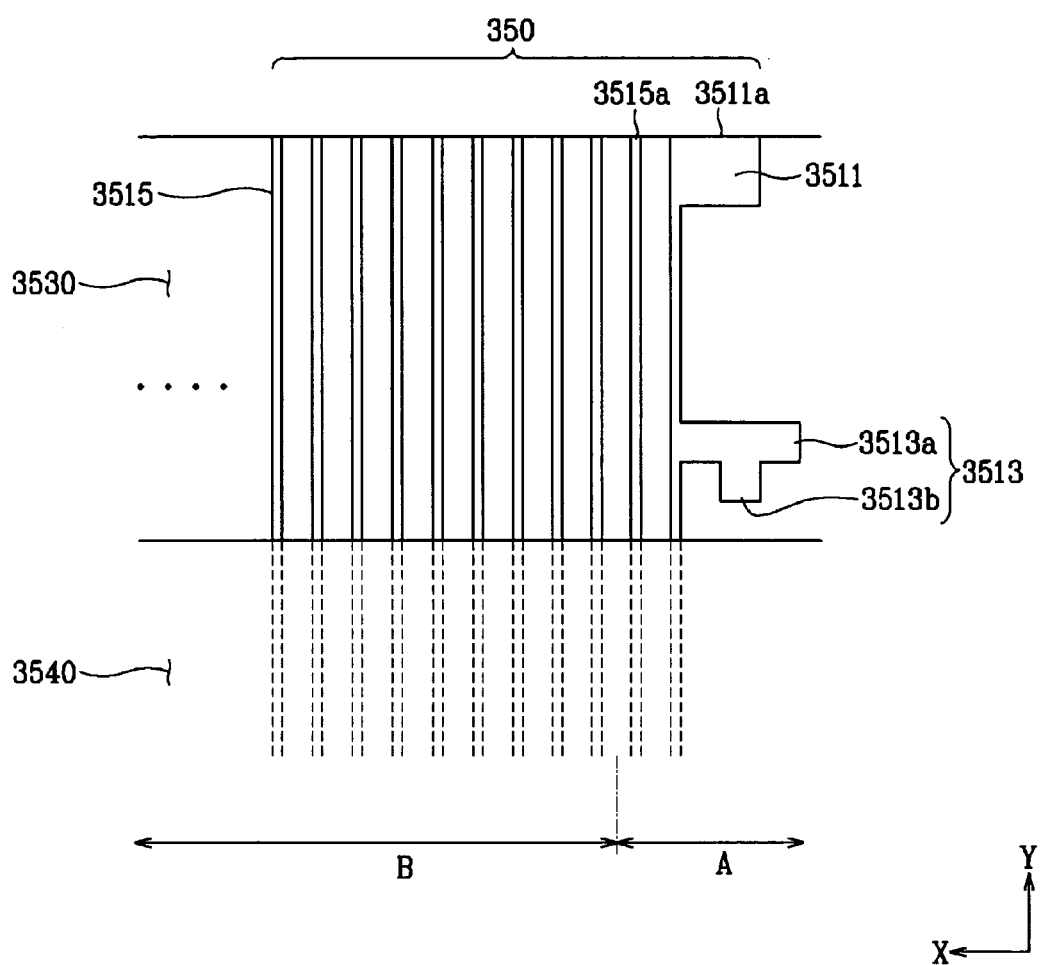
FIG. 3B is a drawing illustrating the cut state of the mother plate for a flexible printed circuit film according to the first embodiment of the present invention.

FIG. 3B shows the flexible printed circuit film after the mother plate for a flexible printed circuit film 35 is cut along the cutting line (C) of FIG. 3A.

The wiring 3515 and the cutting mark 3511 are formed in the base film 3530, and the cover film 3540 is formed over the base film 3530 exposing the wiring 3515. As shown in FIG. 3B, if the flexible printed circuit film is formed by cutting along the cutting line (C), the cutting portion 3511a of the cutting mark 3511 and the edge 3515a of the wiring 3515 are aligned in the same line.

Figure 4A:
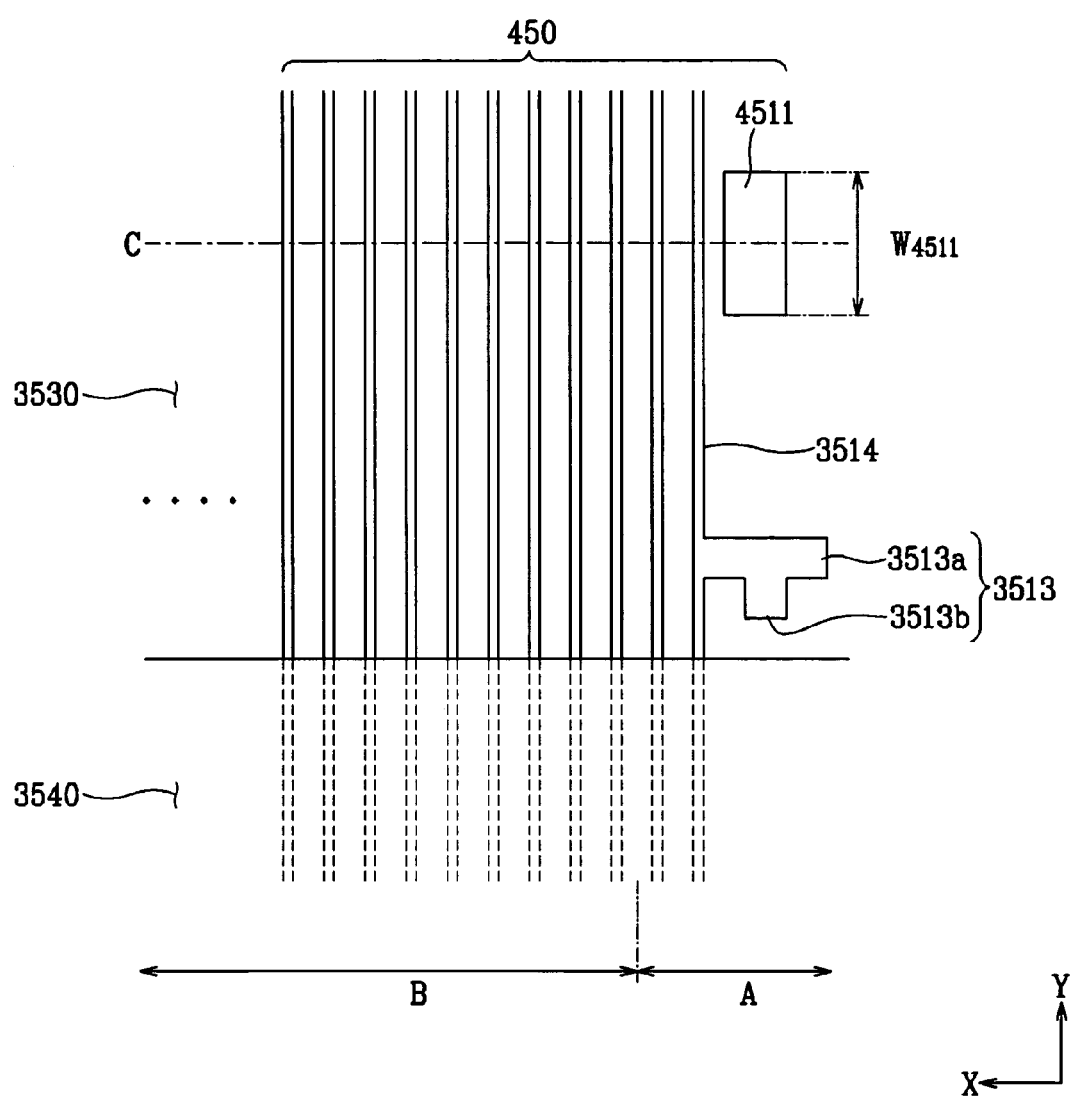
FIG. 4A is an enlarged view of a part of a mother plate for a flexible printed circuit film according to a second embodiment of the present invention.

FIG. 4A is related to a second embodiment of the present invention, which shows a mother plate for a flexible printed circuit film 450 with a different cutting mark 4511. Since the mother plate for a flexible printed circuit film 450 shown in FIG. 4A has the same structure as the mother plate for a flexible printed circuit film according to the first embodiment of the present invention, except for the cutting mark 4511, the detailed description thereof will be omitted and the same reference numerals will be used for elements identical to those appearing in the first embodiment of the present invention. The length ($W_{4511}$) of the cutting mark 4511 is the same as that of the first embodiment of the present invention.

In the second embodiment of the present invention, the cutting mark 4511 is formed to be spaced apart from the dummy wiring 3514. After the cutting mark 4511 is formed with the above, it is cut along the cutting line (C), which is shown in FIG. 4B.

Figure 4B:
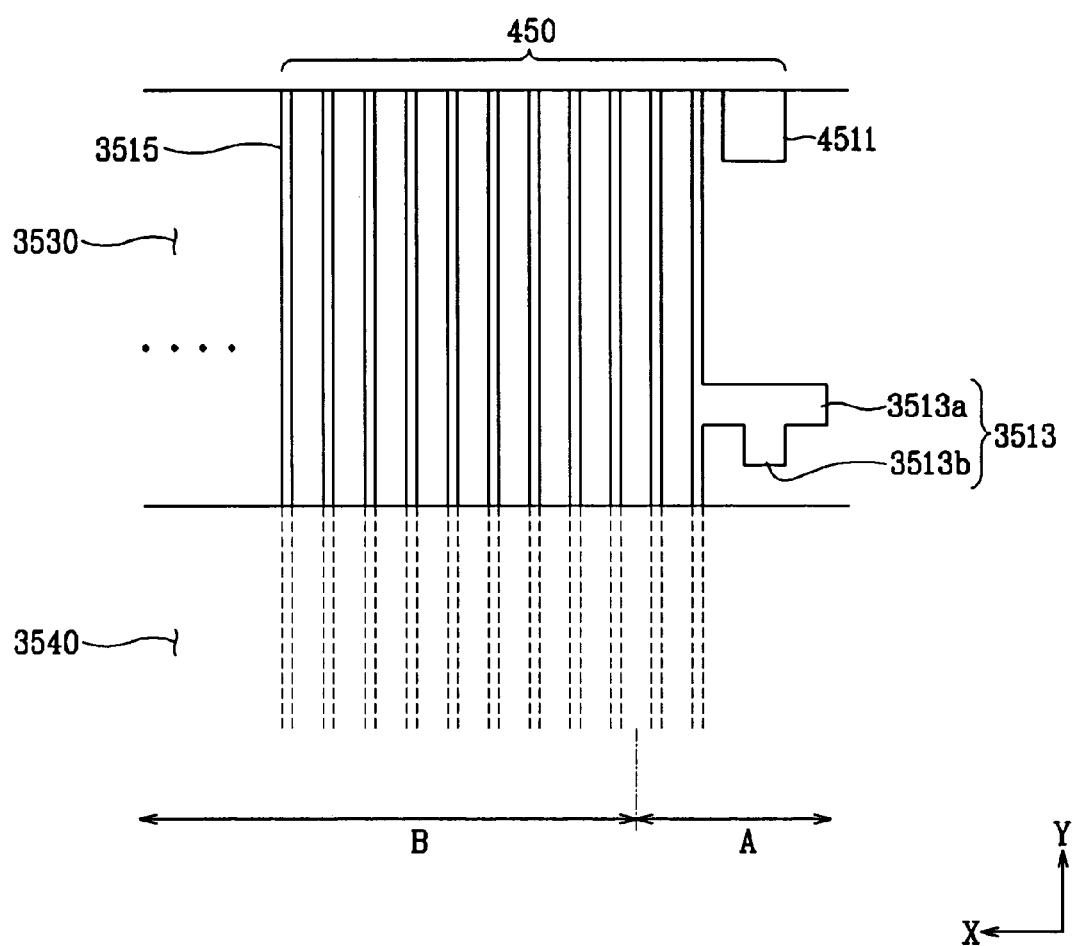
FIG. 4B is a drawing illustrating the cut state of the mother plate for a flexible printed circuit film according to the second embodiment of the present invention.

FIG. 4B shows a flexible printed circuit film having the cutting mark 4511 in the edge of the base film 3530.

The cutting mark 4511 is preferably formed at the edge of the base film 3530 with respect to the Y-axis, but is not limited to any position along the X-axis. Accordingly, the cutting mark 4511 can be formed in the middle of a plurality of the wirings 3515. However, considering the connection with the display panel electrode formed on the TFT panel, it is preferable that the cutting mark 4511 be formed in the edge of the base film 3530.

Figure 5A:
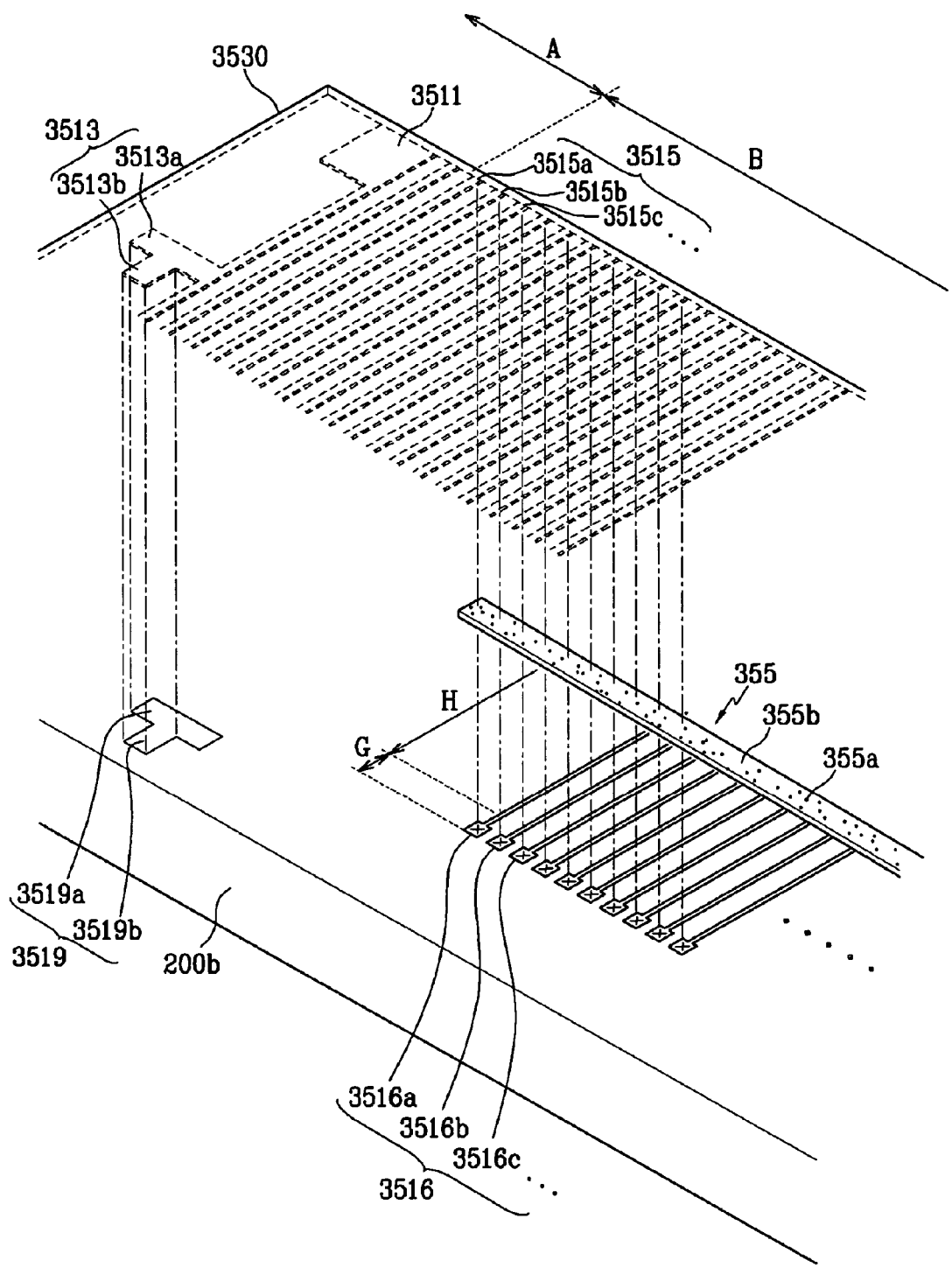
FIG. 5A is a schematic drawing illustrating the state where the flexible printed circuit film cut from the mother plate for a flexible printed circuit film according to the first embodiment of the present invention is adhered to the TFT panel.

FIG. 5A shows a state of attaching the flexible printed circuit film shown in FIG. 3B to the TFT panel 200b using an ACF (anisotropic conductive film) 355.

The flexible printed circuit film shown in FIG. 3B is turned over, and the exposed portion is attached and electrically connected to the display panel electrode 3516 formed on the TFT panel 200b using the ACF 355. The display panel electrode 3516 has an electrode portion (H) and a contact hole portion (G) and is electrically connected to the wiring 3515. Accordingly, the driving signals for driving the LCD panel are transmitted to the display panel electrode 3516 through the flexible printed circuit film. The following will describe the process for attaching the flexible printed circuit film to the TFT panel 200b.

The position of the flexible printed circuit film is adapted to align the align mark 3513 formed on the flexible printed circuit film with another align mark 3519 formed on the TFT panel 200b. The align mark 3513 has two intercrossing align mark portions 3513a and 3513b, and the other align mark 3519 also has two intercrossing align mark portions 3519a and 3519b. Accordingly, these two align mark portions are lined up to align the wiring 3515 with the display panel electrode 3516. The flexible printed circuit film, which is cut based on the predetermined cutting mark 3511, is attached to the TFT panel 200b. Accordingly, the contact hole portion (G) is covered with the flexible printed circuit film so that it is not exposed. This way, the malfunction of the LCD panel does not occur.

The ACF 355 is coated on the display panel electrode 3516 to electrically connect the wiring 3515 with the display panel electrode 3516. The ACF 355 includes a non-conductive matrix 355a mixed with conductive particles 355b. Accordingly, the conductive particles 355b contact the wiring 3515 and the display panel electrode 3516 to establish electrical connection.

Figure 5B:
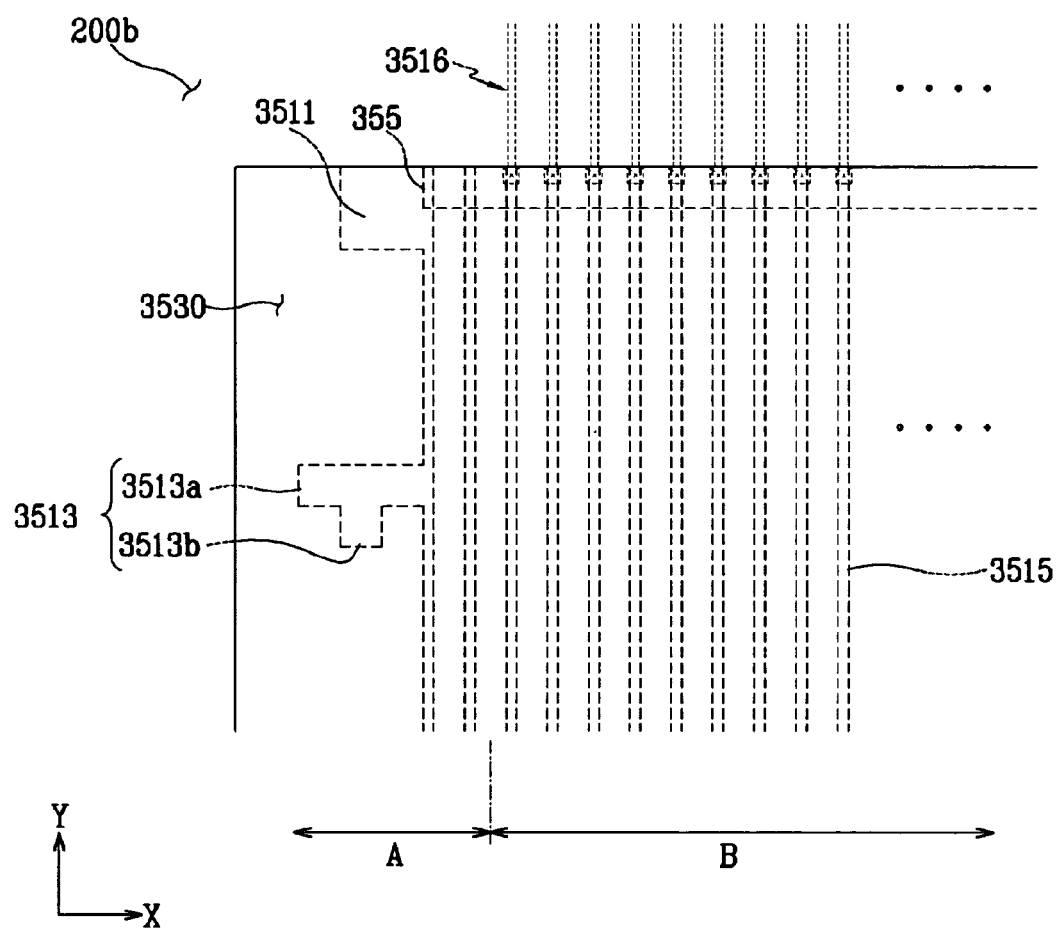
FIG. 5B is a plan view illustrating the state where the flexible printed circuit film is adhered to the TFT panel.

FIG. 5B shows connecting the wiring 3515 with the display panel electrode 3516.

As shown in FIG. 5B, the contact hole portion of the display panel electrode 3516 is entirely covered with the flexible printed circuit film to electrically connect the wiring 3515 and the display panel electrode 3516. Accordingly, the display panel electrode 3516 is not open, and a secure and reliable electrical connection is achieved. In particular, since the contact hole portion is a via hole portion in which an ITO layer is formed on a metal layer, erosion can easily occur if the display panel electrode were opened. However, such erosion can be prevented by establishing the secure electrical connection in the manner shown in FIG. 5B.

The flexible printed circuit film with the above structure can be used with a driver IC chip. That is, the present invention can be applied to COF (chip on film) and TCP (tape carrier package) as well as COG (chip on glass). The following will explain in detail a structure that has a driver integrated circuit chip mounted on a flexible printed circuit film, with reference to FIG. 6.

Figure 6:
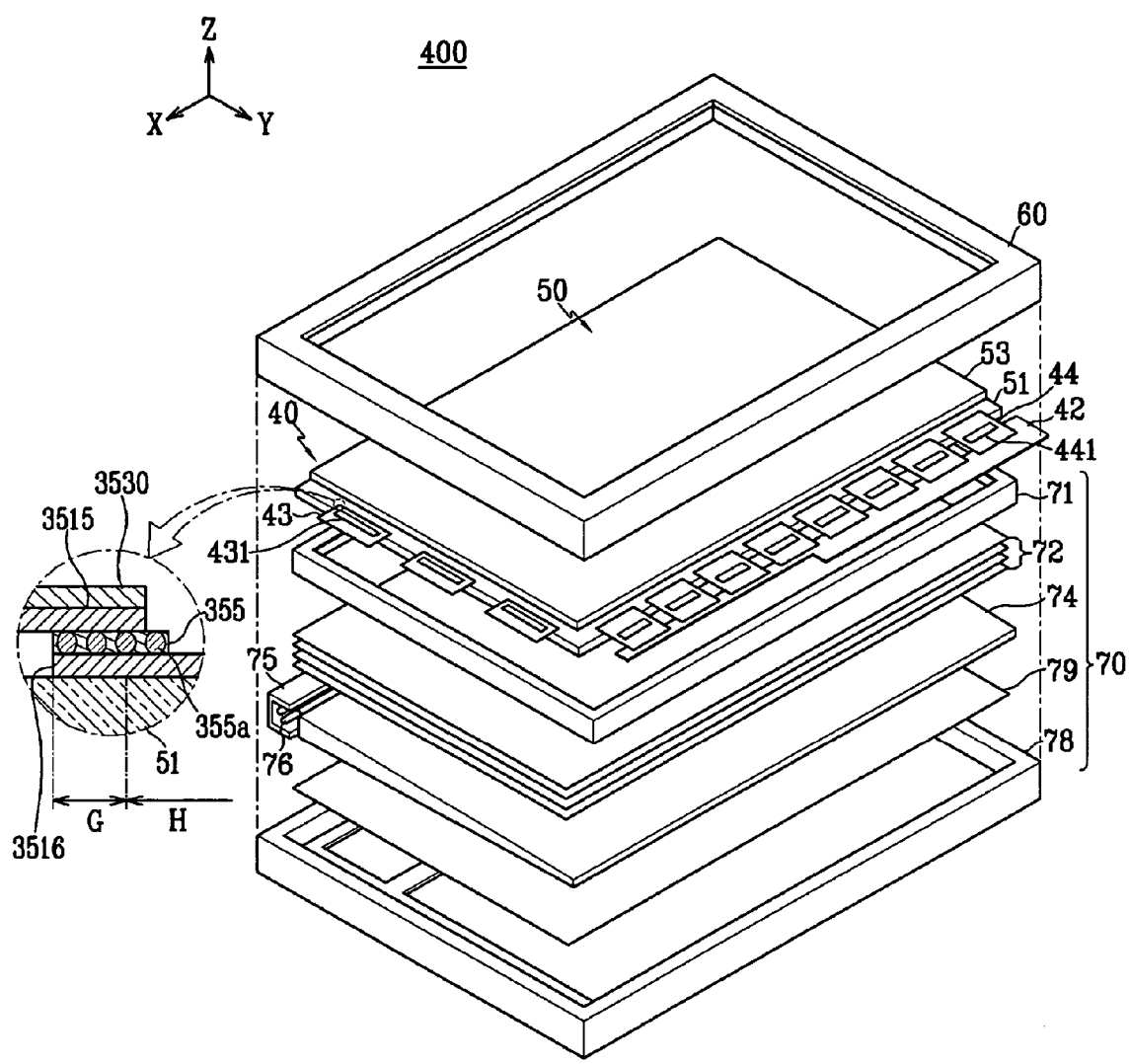
FIG. 6 is an exploded perspective view of a display panel according to the second embodiment of the present invention.

FIG. 6 is an exploded view of a display device 400 used for laptops. Although FIG. 6 shows an LCD device as one example of a display device, this is just an example of the present invention and not a limitation. Accordingly, the display device of the present invention can take various forms other than an LCD device.

The display device 400 shown in FIG. 6 includes an LCD panel 50 for a panel unit displaying an image, and a backlight assembly 70 for supplying light to the LCD panel 50. In addition, it can further include a top chassis 60 for receiving and supporting the LCD panel 50 on the backlight assembly 70.

An LCD panel assembly 40 for driving the LCD panel 50 includes an LCD panel 50, driver IC packages 43 and 44, and a printed circuit board 42. The LCD panel 50 includes a TFT panel 51 comprised of a plurality of thin film transistors, a color filter panel 53 disposed over the TFT panel 51, and a liquid crystal (not shown) interposed between these panels. Since the structure of the LCD panel 50 is the same as the structure of the LCD panel of FIG. 1, detailed description thereof will be omitted.

To control the alignment angles and the alignment timing of the liquid crystal molecules in the LCD panel 50, the driving signals and the timing signals are applied to the gate lines and the data lines of the thin film transistors. The driver IC packages 43 and 44, which decide the applying times of the gate driving signals and the data driving signals respectively, are attached to the gate side and the data side of the LCD panel 50. A COF or TCP can be used as the driver IC package, which can be manufactured by mounting the IC chip on the flexible printed circuit film manufactured according to the present invention. The driver IC packages 43 and 44 are connected to the PCB 42 through the wiring formed on the TFT panel 51. A plurality of elements are mounted on the PCB 42 and connected to a plurality of the wirings formed on the PCB 42.

The PCB 42 which receives the image signals from the outside of the LCD panel assembly 40 and transmits the driving signals to the data lines and the gate lines, is connected to the driver IC packages 43 and 44 having IC chips 431 and 441, respectively. The PCB 42 is connected to the gate COF 43 through the wiring formed on the TFT panel 51. The control board (not shown) connected with the PCB 42 generates gate driving signals and data driving signals for driving the LCD panel 500, and a plurality of timing signals for applying these signals at a proper time. The control board applies these signals to the gate lines and the data lines of the LCD panel 50 through the PCB 42.

The backlight assembly 70 for supplying uniform light to the LCD panel 50 is disposed under the LCD panel assembly 40. The backlight assembly 70 is fixed with an upper mold frame 71 and a lower mold frame 78. The LCD panel 50 is mounted on the upper mold frame 71 and then covered with the top chassis 60 to be fixed.

The backlight assembly 70 includes a light source 76, a light guiding plate 74, a reflecting sheet 79, a light source cover 75, and optical sheets 72. The light source 76 emits light. The light guiding plate 74 guides the light emitted from the light source 76 to the LCD panel 50. The reflecting sheet 79 is disposed on the whole bottom surface of the light guiding plate 74 to reflect the light emitted from the light source 76. The light source cover 75 surrounds and protects the light source 76, and reflects the light emitted from the light source 76 by coating the inner surface thereof with reflecting material. The optical sheets 72 enhance the brightness of the light emitted from the light source 76 and supply it to the LCD panel 50.

Although FIG. 6 shows a lamp as the light source 76, this is not intended to limit the present invention and is only an example of the present invention. Accordingly, the light source can take various other forms such as an LED instead of the lamp, and linear light sources or planar light sources can also be used. An inverter (not shown) is separately mounted to transform outside power to a predetermined power level and it is applied to drive the light source 76.

As shown in the enlarged circle of FIG. 6, the wiring 3515 covered with the base film 3530 is electrically connected to the contact hole portion (G) of the display panel electrode 3516 formed on the TFT panel 51 through the conductive particles 355*a* formed on the ACF 355. Accordingly, the reliability of the electrical connection of the driver IC package 43 of the gate side and the LCD panel 50 can be secured, and opening to the outside of the contact hole portion (G) can be prevented. Although not shown in FIG. 6, the present invention can also be applied to the driver IC package 44 of the data side.

Although a few embodiments of the present invention have been shown and described, it should be appreciated by those skilled in the art that changes may be made to these embodiments without departing from the principles and spirit of the invention, the scope of which is defined in the claims and their equivalents.

What is claimed is:

1. A display device comprising:
  a display panel for a panel unit displaying an image;
  a display panel electrode formed on the display panel; and
  a flexible printed circuit film electrically connected to a terminal of the display panel electrode, wherein the flexible printed circuit film includes:
    a plurality of wirings electrically connected to the display panel electrode and extending along one direction, and
    a cutting mark indicating where the flexible printed circuit film is to be cut, the cutting mark formed in a corner of the flexible printed circuit film and having an edge coinciding with an edge of the flexible printed circuit film, wherein the cutting mark has a width extending along the direction of the width of the wirings and has a different shape than other layouts on the flexible printed circuit film.

2. The display device of claim 1, wherein the flexible printed circuit film further includes an align mark for aligning the flexible printed circuit film with the display panel electrode and having a shape different from the cutting mark.

3. The display device of claim 2, wherein the flexible printed circuit film has a dummy area that is not electrically connected to the display panel electrode, and the align mark is formed in the dummy area.

4. The display device of claim 1, wherein the flexible printed circuit film has a dummy area that is not electrically connected to the display panel electrode, and the cutting mark is formed in the dummy area.

5. The display device of claim 4, wherein the dummy area has a dummy wiring extending substantially parallel to the wiring, and the cutting mark is connected to the dummy wiring.

6. The display device of claim 4, wherein the dummy area has a dummy wiring extending substantially parallel to the wiring, and the cutting mark is spaced apart from the dummy wiring.

7. The display device of claim 1, wherein the flexible printed circuit film further includes:
  a base film receiving the wiring and the cutting mark; and
  a cover film formed on the base film and partially covering the wiring.

8. The display device of claim 7, wherein the edge of the cutting portion and an edge of the wiring form a substantially straight line.

9. The display device of claim 7, wherein the cutting mark is formed at the edge of the base film.

10. The display device of claim 7, wherein the cutting mark is exposed on the base film together with the wiring.

11. The display device of claim 1, wherein the cutting mark has a rectangular shape.

12. The display device of claim 1, wherein the width of the cutting mark is greater than the width of the wiring.

13. The display device of claim 1, wherein a driver integrated circuit chip is mounted in the flexible printed circuit film.

14. The display device of claim 1, wherein the display panel electrode is electrically connected to a driver integrated circuit chip mounted in the display panel.

15. The display device of claim 1, further comprising a backlight assembly for supplying light to the display panel.

16. The display device of claim 1, wherein the length of the cutting mark along the direction parallel to the wiring is from about 100 µm to about 200 µm.

17. The display device of claim 1, further comprising:
  a color filter panel disposed on the display panel; and
  a liquid crystal layer interposed between the display panel and the color filter panel,
  wherein the display panel is a thin film transistor panel.

18. The display device of claim 1, wherein the display device is for a cellular phone.

19. A mother plate for a flexible printed circuit film comprising:
  a base film, and
  a plurality of wiring units formed on the base film,
  wherein each of the wiring units includes:
    a plurality of wirings formed on the base film with a predetermined pattern; and
    a cutting mark formed adjacent to the wirings to visibly indicate a position of a cutting line for separating each of the wiring units from the mother plate and having a width extending along the direction of the width of the wirings.

20. The mother plate for a flexible printed circuit film of claim 19, wherein the cutting line is formed as a straight line along the width direction of the wiring.

21. The mother plate for a flexible printed circuit film of claim 20, wherein the cutting line passes through the center of the cutting mark.

22. The display device of claim 1, wherein the cutting mark is wider than the wiring.

23. The mother plate of claim 19, wherein the cutting mark is wider than each of the wirings.

24. The display device of claim 1, wherein the wiring is rectilinear throughout the flexible printed circuit film.

25. The mother plate of claim 19, wherein the mother plate is divided into blocks with each of the blocks having a cutting mark, further comprising a cover film having a substantially identical pattern in each of the blocks.

26. The display device of claim 1, wherein the cutting mark is positioned such that a portion of it remains on the flexible printed circuit film after cutting.

27. The mother plate of claim 19, wherein the cutting mark is positioned such that a portion of it remains on the wiring units after the wiring units are separated from the mother plate.

* * * * *